(12) United States Patent
Cotte et al.

(10) Patent No.: US 8,338,920 B2
(45) Date of Patent: Dec. 25, 2012

(54) PACKAGE INTEGRATED SOFT MAGNETIC FILM FOR IMPROVEMENT IN ON-CHIP INDUCTOR PERFORMANCE

(75) Inventors: John Michael Cotte, New Fairfield, CT (US); Hanyi Ding, Essex Junction, VT (US); Kai Di Feng, Hopewell Junction, NY (US); Zhong-Xiang He, Essex Junction, VT (US); Nils D. Hoivik, Pleasantville, NY (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 1252 days.

(21) Appl. No.: 11/690,682

(22) Filed: May 8, 2007

(65) Prior Publication Data

US 2008/0277769 A1 Nov. 13, 2008

(51) Int. Cl.
*H01L 23/552* (2006.01)

(52) U.S. Cl. ............ 257/659; 257/700; 257/E33.056; 438/106

(58) Field of Classification Search .......... 257/659, 257/700, E33.056; 438/106
See application file for complete search history.

(56) References Cited

U.S. PATENT DOCUMENTS

| | | | |
|---|---|---|---|
| 6,137,358 A * | 10/2000 | Midya et al. ............... 330/136 |
| 6,287,932 B2 | 9/2001 | Forbes et al. |
| 6,593,841 B1 * | 7/2003 | Mizoguchi et al. .......... 336/200 |
| 7,280,024 B2 * | 10/2007 | Braunisch ................. 336/200 |
| 2003/0234436 A1 | 12/2003 | Hsu et al. |
| 2006/0019422 A1 * | 1/2006 | Tuttle et al. ................. 438/55 |
| 2007/0188620 A1 * | 8/2007 | Takahashi .............. 348/208.99 |
| 2008/0029879 A1 * | 2/2008 | Tuckerman et al. .......... 257/704 |

* cited by examiner

*Primary Examiner* — Thao Le
*Assistant Examiner* — Matthew Gordon
(74) *Attorney, Agent, or Firm* — F. Chau & Associates, LLC; Daniel P. Morris, Esq.

(57) ABSTRACT

An integrated circuit package includes an integrated circuit with one or more on-chip inductors. A package cover covers the integrated circuit. A magnetic material is provided between the integrated circuit and the package cover. The magnetic material may be a soft magnetic thin film. The magnetic material may be affixed to the package cover by an adhesive. The magnetic material may be formed directly on the package cover by one of deposition, sputtering or spraying. The magnetic material may be affixed to the integrated circuit.

20 Claims, 9 Drawing Sheets

PACKAGE INTEGRATED SOFT MAGNETIC FILM FOR IMPROVEMENT IN ON-CHIP INDUCTOR PERFORMANCE

BACKGROUND OF THE INVENTION

1. Technical Field

The present disclosure relates to on-chip inductor performance and, more specifically, to a package integrated soft magnetic film for improvement in on-chip inductor performance.

2. Discussion of the Related Art

Large groups of integrated circuits (ICs) are generally produced on a single semiconductor wafer. The wafer is then cut into small units called dies with each die containing the integrated circuit. Each die is then contained into a small package that protects the die and facilitates interconnection. The package may be made of an insulating material such as ceramic, plastic, or epoxy. The package may also include a grounded plane made of a conductive material such as a metal.

The integrated circuits may contain a variety of miniaturized electrical devices and interconnections. One such electrical device is the inductor. The inductor is a circuit element that opposes change in current with an inductance L. The inductor may be especially useful in analog circuits and mixed-signal circuits. The inductor may foe formed by a conductive coil. An ideal inductor has no resistance. However, typical inductors have a resistance R that results from resistive losses in the conductive coil. The resistance of the inductor may convert current flowing through the coil into heat, thus causing a loss of inductive quality. Typically, the inductive quality may be expressed in terms of an inductor Q-factor where the Q-factor represents a frequency-dependent ratio of inductance, L, over coil resistance, R. Accordingly, the Q-factor represents a measure of an inductor's efficiency. The higher the Q-factor of the inductor, the closer the inductor is to behaving like an ideal, lossless inductor.

Miniaturized inductors that are formed within the IC are referred to as on-chip inductors. On-chip inductors may be formed as a conductive spiral using conventional IC processing techniques and are typically of planar nature. On-chip inductors are generally formed using the topmost metal layers of an IC process as these top metal layers tend to foe thicker and have lower resistances than other layers of the IC. Moreover, forming on-chip inductors on the top metal layers is commonly employed to reduce capacitive coupling to the conductive substrate below.

While there are many methods available for mounting IC chips for use, the flip-over die or flip chip is mounted without the need for wire bonds. Here, solder bumps are deposited on the chip pads. The IC is then mounted upside down in the package and the solder is reflowed. This mounting is also known as controlled collapse chip connection (C4).

For flip-over die, the top metal layer of the IC chip which includes the miniaturized inductors will be in close proximity to the package lid. This is also the case for a wire bond package or surface of a printed circuit board that the IC is mounted to in a C4 package. Accordingly, the magnetic field of the inductors will couple to the metal connections, or traces, in the package printed circuit board which will negatively affect the inductor performance. For example, the inductance Q-factor may be decreased due to the eddy current set up in the metal connections on the printed circuit board.

One approach to remedy this problem is to re-rout the conductive metal traces in the printed circuit board around areas in close proximity to the on-chip inductors. Alternatively or additionally, a large distance may be left between the on-chip inductors and the printed circuit board of the packaging. However, such approaches may be difficult to implement for complex ICs and may reduce the extent to which the circuits may be miniaturized.

Another approach is to incorporate a magnetic material into the IC chip stack both above and below the metal layers used to define the planar inductor. This approach requires complex and expensive alteration and/or post-processing of the IC.

SUMMARY

An integrated circuit package includes an integrated circuit with one or more on-chip inductors. A package cover covers the integrated circuit. A magnetic material is provided between the integrated circuit and the package cover.

An integrated circuit package includes an integrated circuit with one or more on-chip inductors flip-chip mounted over a package printed circuit board (PCB). One or more pads separate the integrated circuit from the package PCB. A magnetic material is provided between the integrated circuit and the package PCB.

A method for packaging an integrated circuit with one or more on-chip inductors includes attaching the integrated circuit to a package. A magnetic material is affixed to a package cover. The integrated circuit is covered with the package cover.

A method for packaging an integrated circuit with one or more on-chip inductors includes affixing a magnetic material to a package PCB. The integrated circuit is flip-chip mounted over the package PCB such that the magnetic material is provided between the integrated circuit and the package PCB.

The magnetic material may be a soft magnetic thin film. The magnetic material may be affixed to the package cover by an adhesive. The magnetic material may be formed directly on the package cover by one of deposition, sputtering or spraying. The magnetic material may be affixed to the integrated circuit.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DETAILED DESCRIPTION OF THE EXEMPLARY EMBODIMENTS

Figure 1A:
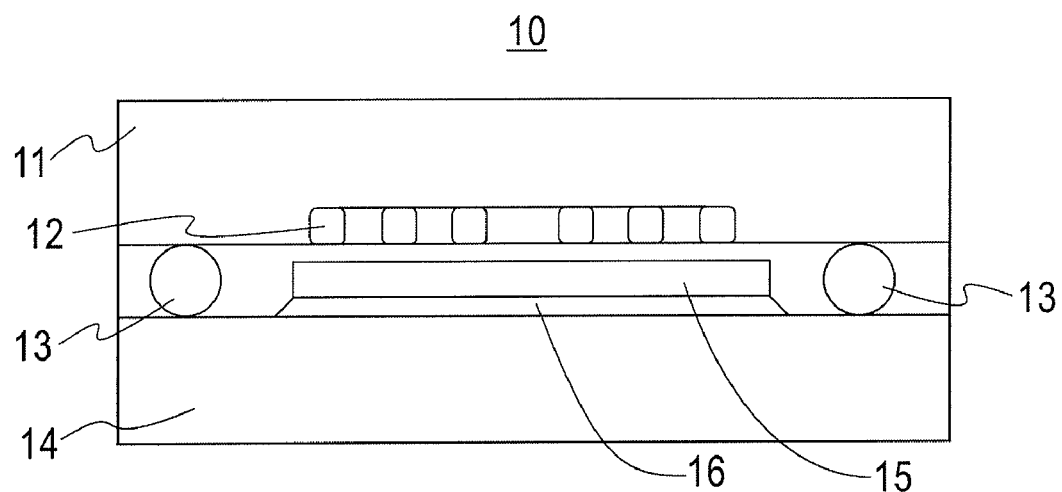
FIG. 1 is a schematic showing the structure of a C4 package including a die including on-chip inductors separated from a package printed circuit board (PCB) by a thin film of soft magnetic material according to an exemplary embodiment of the present invention.

In describing exemplary embodiments of the present disclosure illustrated in the drawings, specific terminology is employed for sate of clarity. However, the present disclosure is not intended to be limited to the specific terminology so selected, and it is to be understood that each specific element includes all technical equivalents which operate in a similar manner.

According to an exemplary embodiment of the present invention, a magnetic material, for example a thin-film soft magnetic material, is placed between the IC and the printed circuit board (PCB). As the PCB may contain metal traces, by placing the magnetic material between the IC and the metal traces of the PCB, the magnetic field generated by the on-chip inductors may foe isolated from the metal traces. Accordingly, buildup of eddy currents in the metal connections may be avoided. Moreover, the inductor Q-factor may foe increased.

These features may be realized without complex and expensive alteration or post-processing of ICs because the magnetic material is not incorporated into the IC chip stack, rather, the magnetic material is placed outside of the IC. Moreover, by placing the magnetic material outside of the IC stack, the magnetic material may be formed with any desired thickness and with a wide range of available materials to obtain maximum performance increase in the inductor. Therefore, fabrication complexity and cost is minimized.

The magnetic material may foe selected for use for particular dies including particular inductors or the same magnetic material may be used for multiple different types of dies including different types of inductors. However, the composition and thickness of the magnetic material used may be sufficient to provide effective isolation for the inductors used. For example, a high permeability ferromagnetic material, such as pure iron or a NiFe alloy may be used. An example of a high permeability NiFe alloy is 81% Ni and 19% Fe. Magnetic oxide films may also be suitable for use.

The magnetic material may be formed of alloys such as permalloy ($Ni_8OFe_2O$), orthnol ($Ni_5OFe_5O$), amorphous CoFeCu, supermalloy (NiFeMo), and polymer ferite materials. Polymide filled NiZn and MnZn may also be used.

Figure 1B:
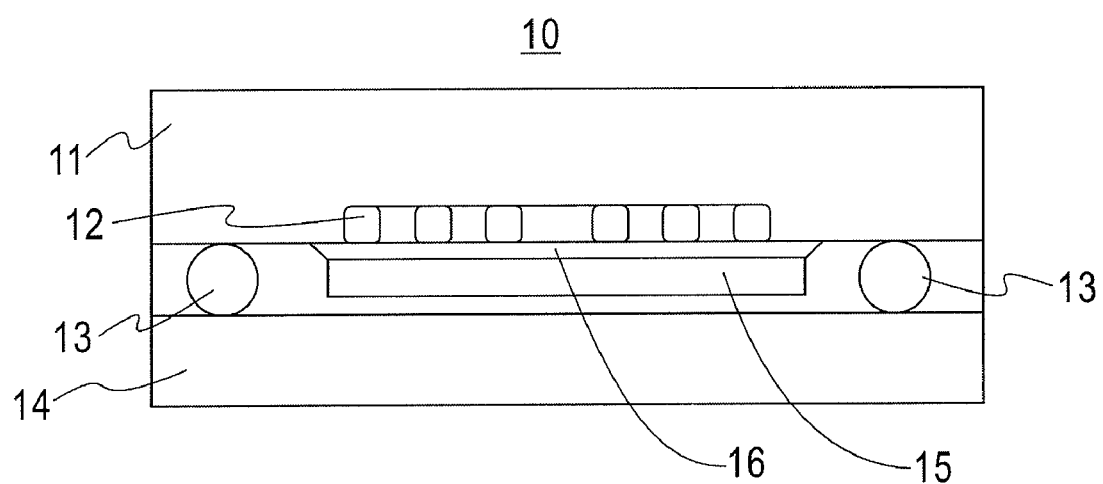

FIGS. 1 (a) and (b) are schematics showing the structure of a C4 package including a die including on-chip inductors separated from a package printed circuit board (PCB) by a thin film of soft magnetic material according to an exemplary embodiment of the present invention. FIG. 1 (a) shows a packaging arrangement 10 including a die 11 with one or more on-chip inductors 12. The die 11 is flip-chip mounted on a package PCB 14 with one or more controlled collapse chip connection (C4) pads 13 separating the die 11 from the PCB 14.

A magnetic material 15, for example, a thin-film of soft magnetic material, may be provided between the die II and the PCB 14. For example, the magnetic material 15 may be attached to the PCB 14 by an adhesive 16, for example, glue. Alternatively, the magnetic material may be directly formed onto the PCB, for example, by deposition, sputtering, spraying, etc.

According to other exemplary embodiments of the present invention, for example as seen in FIG. 1 (b), the magnetic material 15 may foe attached to or formed on a die other than a PCB. According to one exemplary embodiment of the present invention, the magnetic material 15 may be attached to or formed on the die 11. However, any combination of the above-described exemplary embodiments may be possible; for example, a magnetic material 15 may be attached to or formed on both the die 11 and the package/PCB 14.

The presence of the magnetic material between the on-chip inductors 12 and the PCB 14 may isolate the magnetic field produced by the inductors 12 from metal traces or other conductive features of the PCB 14. The buildup of magnetic eddy currents may thereby be minimized and/or prevented.

Figure 2A:
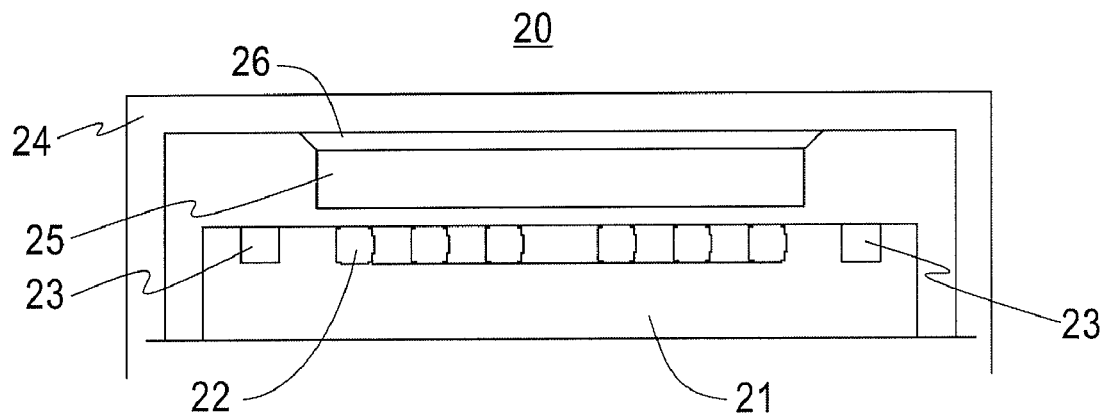
FIG. 2 is a schematic showing the structure of a wire bond package including a packaged die including on-chip inductors where a magnetic material is attached to or formed on a package lid according to an exemplary embodiment of the present invention.
Figure 2B:
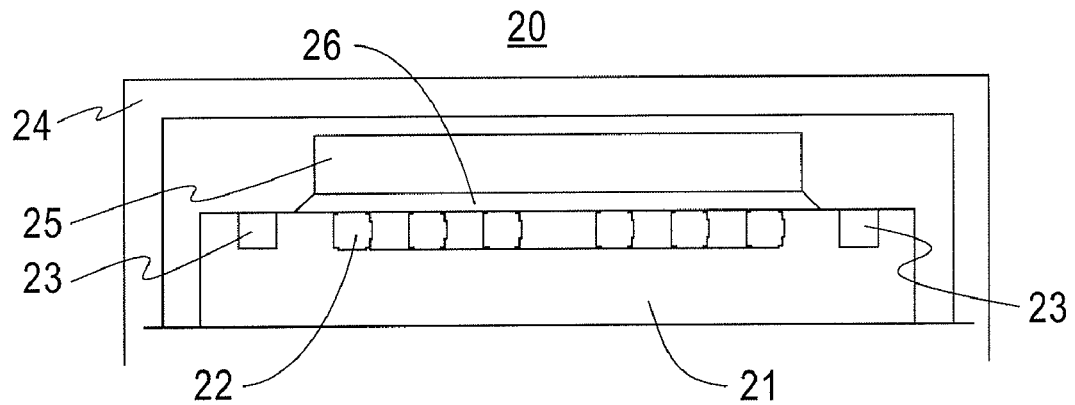

Exemplary embodiments of the present invention may be implemented with other packaging approaches. FIGS. 2 (a) and (b) are schematics of a wire bond package showing a packaged die including on-chip inductors where a magnetic material is attached to or formed on a package lid according to an exemplary embodiment of the present invention.

FIG. 2 (a) shows a packaging arrangement 20 including a die 21 with one or more on-chip inductors 22. The illustrated packaging approach makes use of a package cover 24, for example, a lid. A magnetic material 25, for example, a thin film of a soft magnetic material, may be attached to an inside surface of the package cover 24. For example, an adhesive 26 such as glue may be used to attach the magnetic material 25 to the inside surface of the package cover 24. Alternatively, the magnetic material 25 may be directly forted onto the package cover 24, for example, by deposition, sputtering, spraying, etc. One or more pads 23 may separate the die 21 from the package cover 24.

According to one exemplary embodiment, the magnetic material may foe attached to or formed on the inside surface of the package cover prior to assembly.

According to other exemplary embodiments of the present invention, for example as seen in FIG. 2 (b), the magnetic material 25 may be attached to or formed on a die other than a lid of the package. According to one exemplary embodiment of the present invention, the magnetic material 25 may be attached to or formed on the die 21. However, any combination of the above-described exemplary embodiments may be possible; for example, a magnetic material 25 may be attached to or formed on both the die 21 and the package lid.

Figure 3:
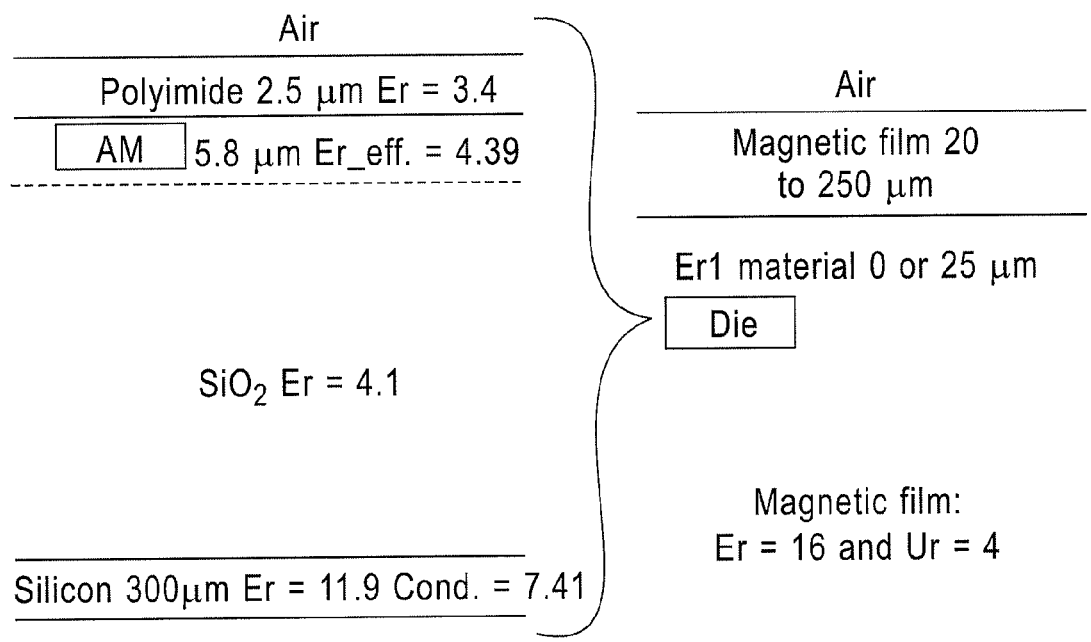
FIG. 3 is an illustration of placement of a magnetic film in proximity to a chip (die), used with a planar inductor situated 3-5 μm beneath the top surface of the die.

FIG. 3 is a schematic of an example where the magnetic material is located above a die with, on-chip inductors. Such a die would typically include a top metal layer (labeled AM—Analog Metal) in which the inductor is fabricated. Traditionally, a silicon oxide layer covers the AM metal together with a 2.5 μm polymide layer with an Er=3.4. Here, a magnetic material of a thickness between 20 μm and 250 μm is placed above the surface of the die, as shown, with an Er1 material having a thickness of 0 or 25 μm placed therebetween. Tests are run on this example die stack configuration to assess the effect of magnetic material thickness.

Figure 4A:
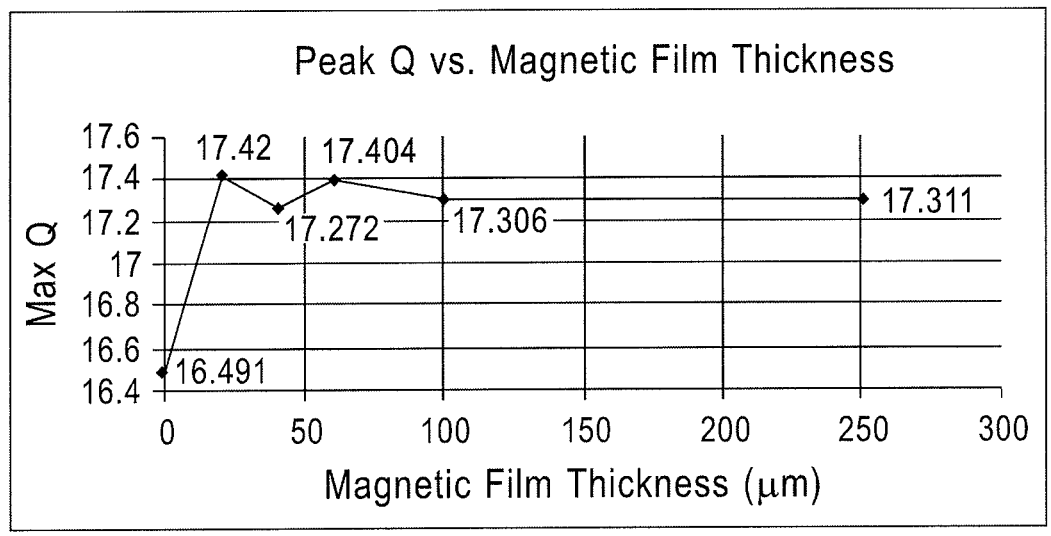
FIG. 4(A) shows the relationship between peak Q-value and magnetic material thickness for the example configuration shown in FIG. 3 according to an exemplary embodiment of the present invention.
Figure 4B:
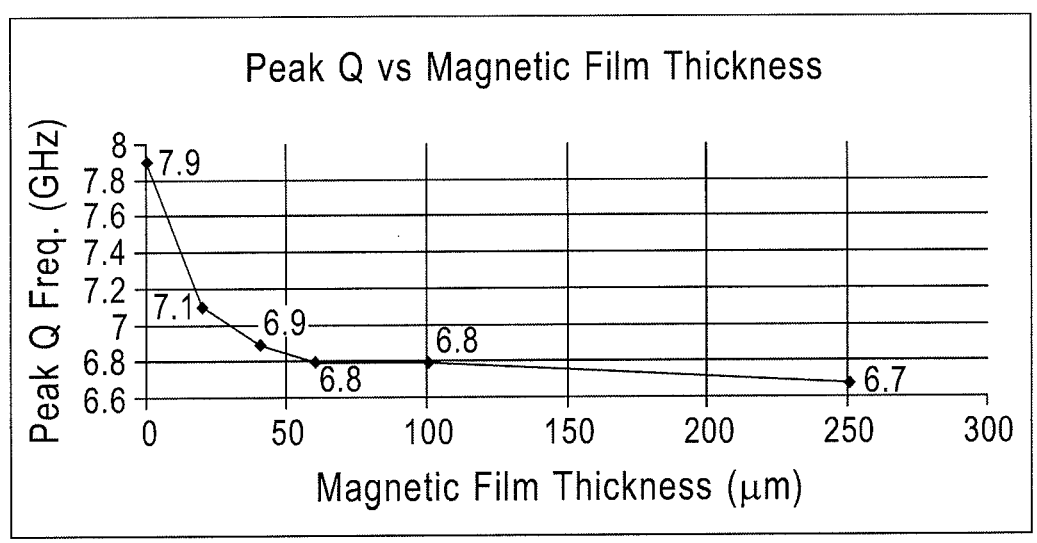
FIG. 4(B) shows the relationship between peak Q-frequency and magnetic material thickness for the example configuration shown in FIG. 3 according to an exemplary embodiment of the present invention.
Figure 4C:
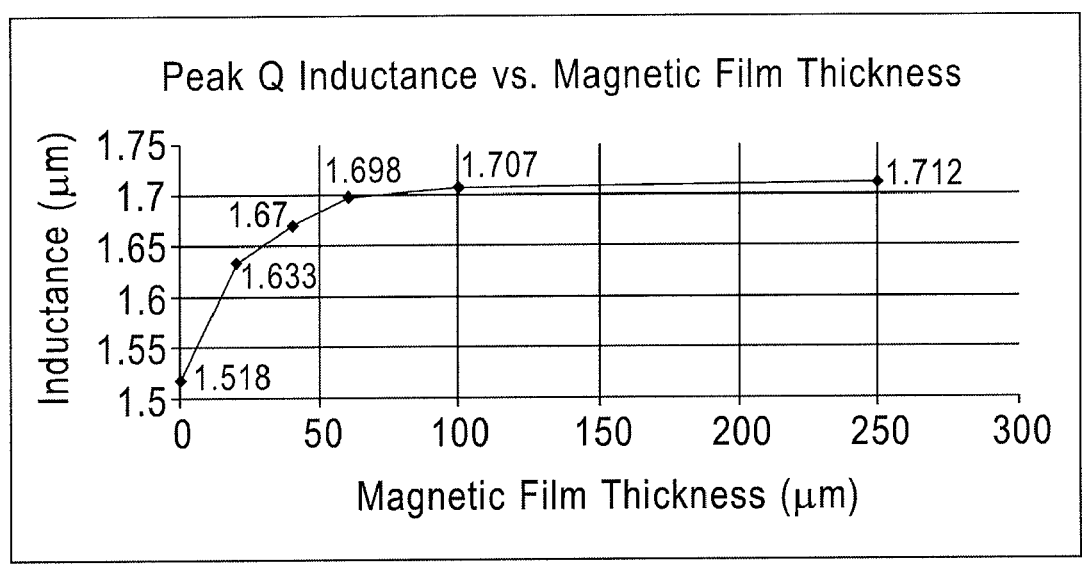
FIG. 4(C) shows the relationship between peak Q-inductance and magnetic material thickness for the example configuration shown in FIG. 3 according to an exemplary embodiment of the present invention.

FIGS. 4(A)-(C) illustrate the effect of magnetic material thickness. A thicker magnetic material provides a substantial increase in inductance. Q-factor values may also increase with the use of a thicker magnetic material; however, the Q-factor increase may not be as substantial as the inductance increase. The distance between the magnetic material and the die is fixed at 25 μm. The permeability of the selected magnetic material is Ur=4.

FIG. 4(A) shows the relationship between peak Q-value and magnetic material thickness for the example configuration shown in FIG. 3. Because the Q-factor is frequency dependent, the peak Q-value (the value of the peak Q-factor), peak Q-frequency (the frequency at which the Q-factor peaks) and peak Q-inductance (the inductance at the peak Q-frequency) may foe used to demonstrate Q-factor characteristics. As can be seen from FIG. 4(A), the peak Q-value increases as the thickness of the magnetic material increases up to a thickness of 50 μm, at which point a constant peak Q-value is achieved.

FIG. 4(B) shows the relationship between peak Q-frequency and magnetic material thickness for the example configuration shown in FIG. 3. As can be seen from FIG. 4(B), an increased magnetic material thickness reduces the peak Q-frequency.

FIG. 4(C) shows the relationship between peak Q-inductance and magnetic material thickness for the example configuration shown in FIG. 3. As can be seen from FIG. 4(C), as the magnetic material thickness increases, the peak Q-inductance increases as well.

Figure 5A:
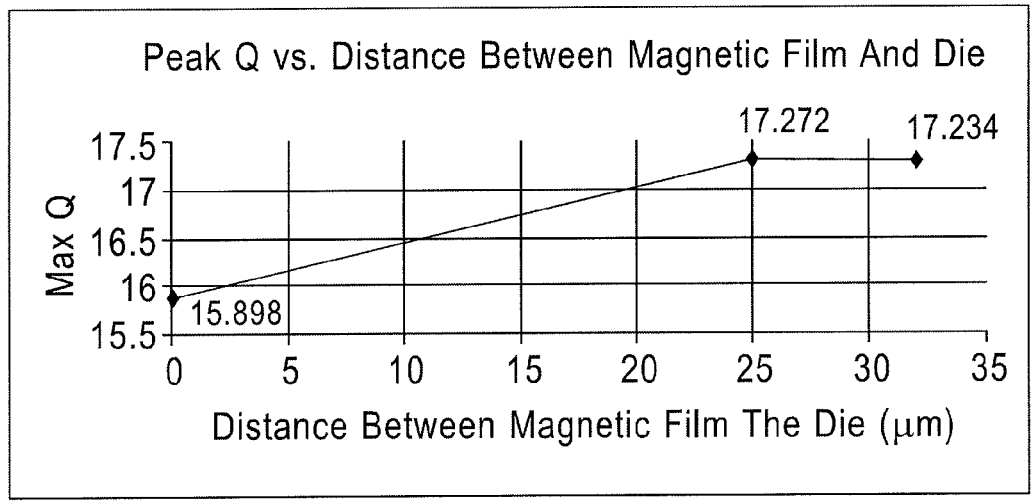
FIG. 5(A) shows the relationship between peat Q value and the distance between the magnetic material and the die for the example configuration shown in FIG. 3 according to an exemplary embodiment of the present invention.
Figure 5B:
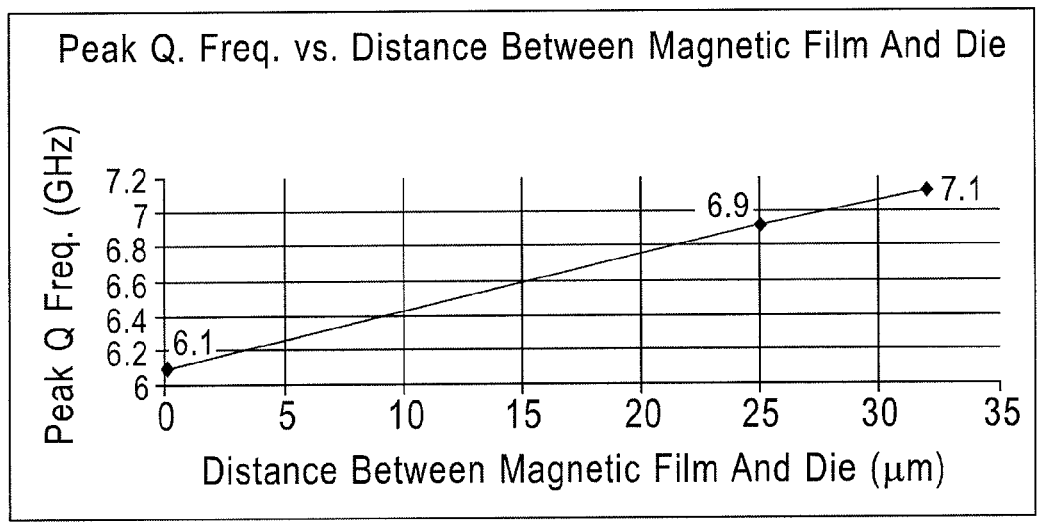
FIG. 5(B) shows the relationship between peak Q frequency and the distance between the magnetic film and the die for the example configuration shown in FIG. 3 according to an exemplary embodiment of the present invention.
Figure 5C:
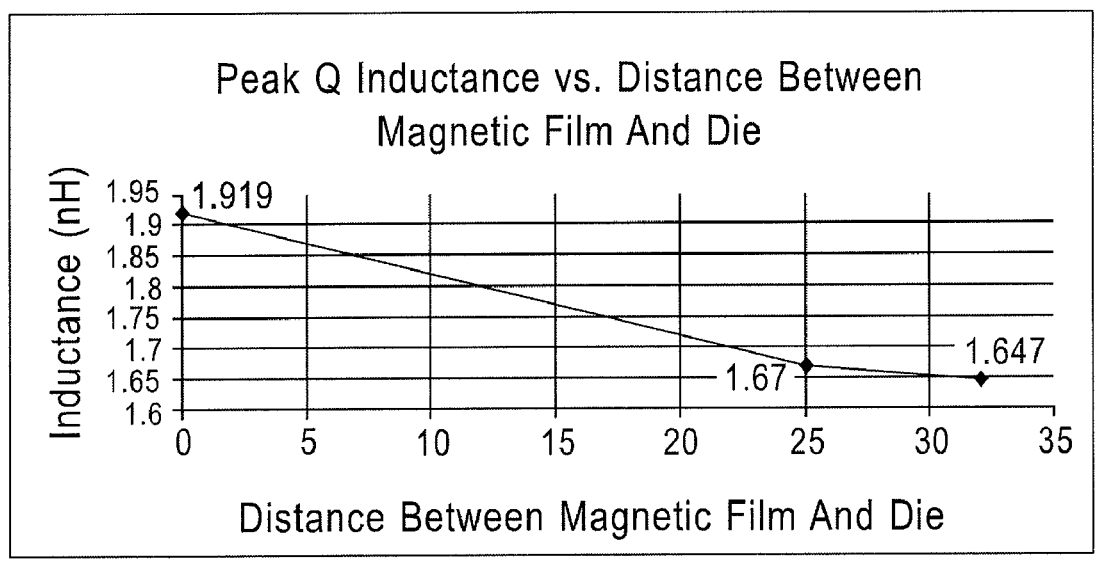
FIG. 5(C) shows the relationship between peak Q inductance and the distance between the magnetic film and the die for the example configuration shown in FIG. 3 according to an exemplary embodiment of the present invention.

FIGS. 5(A)-(C) illustrate the effect of the distance between the magnetic material and the inductors on inductor performance. Placing the magnetic material close to the inductors substantially increases inductance while lowering the Q-factor and the peak Q frequency. Optimal peak Q value is shown to occur at a distance of 25 μm. For the case where the distance between the magnetic material and the die is zero, the magnetic material used has a thickness of 20 μm. In the other two cases, the magnetic material used has a thickness of 40 μm.

FIG. 5(A) shows the relationship between peak Q value and the distance between the magnetic material and the die for the example configuration shown in FIG. 3. Increasing the separation between the magnetic material and the on-chip inductors increases the maximum Q-factor value.

FIG. 5(B) shows the relationship between peak Q frequency and the distance between the magnetic film and the die for the example configuration shown in FIG. 3. The peak Q frequency increases as the separation between the magnetic material and the on-chip inductors increases.

FIG. 5(C) shows the relationship between peak Q inductance and the distance between the magnetic film and the die for the example configuration shown in FIG. 3. The peak Q inductance decreases as the separation between the magnetic material and the on-chip inductors increases.

Figure 6A:
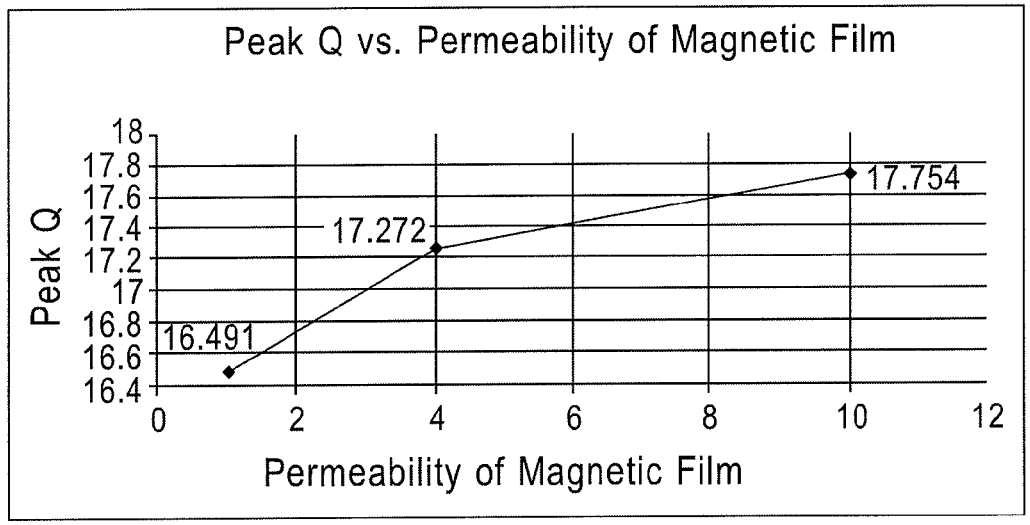
FIG. 6(A) shows the relationship between peak Q value and the permeability of the magnetic material for the example configuration shown in FIG. 3 according to an exemplary embodiment of the present invention.
Figure 6B:
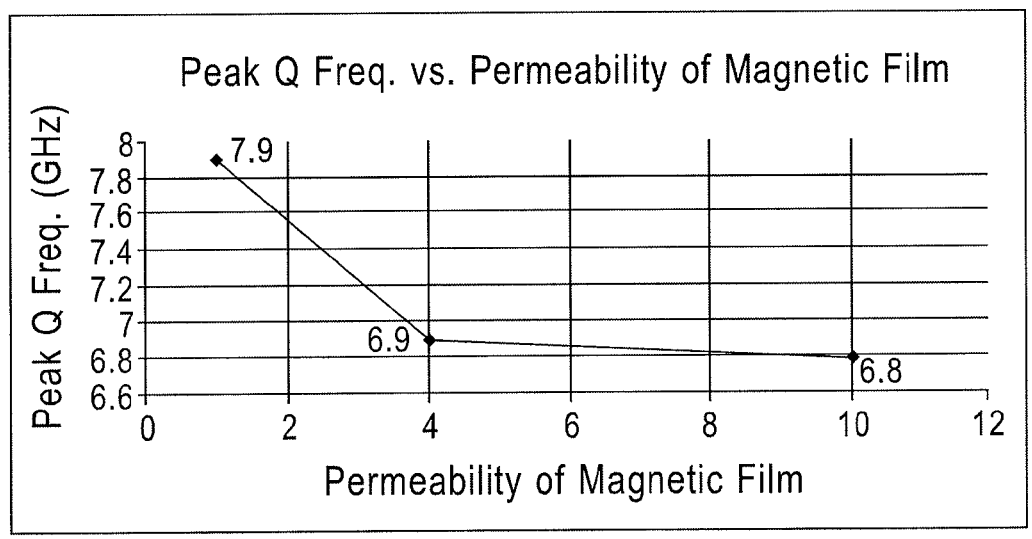
FIG. 6(B) shows the relationship between the peak Q frequency and the permeability of the magnetic material for the example configuration shown in FIG. 3 according to an exemplary embodiment of the present invention.
Figure 6C:
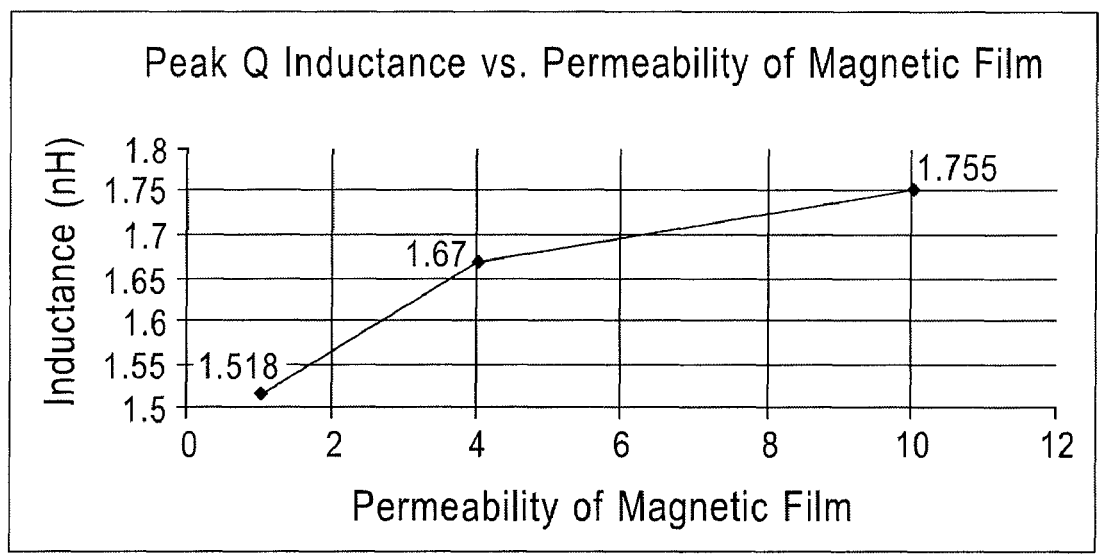
FIG. 6(C) shows the relationship between the peak Q inductance and the permeability of the magnetic material for the example configuration shown in FIG. 3 according to an exemplary embodiment of the present invention.

FIGS. 6(A)-(C) illustrate the effect of the permeability of the magnetic material on the Q-factor. A higher magnetic material permeability increases peak Q inductance and the peak Q-value and decreases the peak Q frequency. The thickness of the magnetic material used is 40 μm and the distance between the magnetic material and the die is 25 μm.

FIG. 6(A) shows the relationship between peak Q value and the permeability of the magnetic material for the example configuration shown in FIG. 3. As the permeability is increased, the peak Q value of the on-chip inductors is increased.

FIG. 6(B) shows the relationship between the peak Q frequency and the permeability of the magnetic material for the example configuration shown in FIG. 3. As the permeability is increased, the peak Q frequency is reduced.

FIG. 6(C) shows the relationship between the peak Q inductance and the permeability of the magnetic material for the example configuration shown in FIG. 3. As the permeability is increased, the peak Q inductance increases.

Accordingly, as the thickness of the magnetic material increases, inductance values may substantially increase. The Q-factor may increase as well in response to the use of a thicker magnetic material. However, the increase of the Q-factor may not be as dramatic as the increase on the inductance values. Moreover, the peak Q frequency may be reduced as a result of using a thicker magnetic material. For example, the magnetic material added to the top of an on-chip inductor at the package level increases the inductance value by more than 10% and the Q factor by several percent, depending upon the magnetic film thickness and permeability constant value. The cost of this integration approach is the relative lower peak Q frequency, which may be compensated for by using an inductor of a smaller size in the die design. Accordingly, it can be seen from the above disclosure that a desirable distance between the magnetic material and the die is about 25 μm and a desirable thickness of the magnetic material is about 60 μm.

The above specific exemplary embodiments are illustrative, and many variations can be introduced on these embodiments without departing from the spirit of the disclosure or from the scope of the appended claims. For example, elements and/or features of different exemplary embodiments may be combined with each other and/or substituted for each other within the scope of this disclosure and appended claims.

What is claimed is:

1. An integrated circuit package, comprising:
   an integrated circuit with one or more on-chip inductors formed on a top layer thereof;
   a package cover covering the integrated circuit; and
   a magnetic material provided between the integrated circuit and the package cover and magnetically shielding the on-chip inductors from circuitry above the package cover, wherein the magnetic material is not part of the integrated circuit's stack and the magnetic material is affixed to but not part of the package cover.

2. The integrated circuit package of claim 1, wherein the magnetic material is a soft magnetic thin film.

3. The integrated circuit package of claim 1, wherein the magnetic material is affixed to the package cover by an adhesive.

4. The integrated circuit package of claim 1, wherein the magnetic material is formed directly on the package cover by one of deposition, sputtering or spraying.

5. The integrated circuit package of claim 1, wherein the magnetic material is affixed to the integrated circuit.

6. An integrated circuit package, comprising:
   an integrated circuit with one or more on-chip inductors formed on a top layer thereof and flip-chip mounted over a package printed circuit board (PCB);

one or more pads separating the integrated circuit from the package PCB; and a magnetic material provided between the integrated circuit and the package PCB and magnetically shielding the on-chip inductors from circuitry of the package PCB, wherein the magnetic material is not part of the integrated circuit's stack and the magnetic material is affixed to but not part of the package PCB.

7. The integrated circuit package of claim 6, wherein the magnetic material is a soft magnetic thin film.

8. The integrated circuit package of claim 6, wherein the magnetic material is affixed to the package PCB by an adhesive.

9. The integrated circuit package of claim 6, wherein the magnetic material is formed directly on the package PCB by one of deposition, sputtering or spraying.

10. The integrated circuit package of claim 6, wherein the magnetic material is affixed to the integrated circuit.

11. A method for packaging an integrated circuit with one or more on-chip inductors formed on a top layer thereof, comprising:

attaching the integrated circuit to a package;

affixing a magnetic material to a package cover, such that the magnetic material is provided between the integrated circuit and the package cover, and magnetically shielding the on-chip inductors from circuitry above the package cover, wherein the magnetic material is not part of the integrated circuit's stack and the magnetic material is affixed to but not part of the package cover; and covering the integrated circuit with the package cover.

12. The method of claim 11, wherein the magnetic material is a soft magnetic thin film.

13. The method of claim 11, wherein the magnetic material is affixed to the package cover by an adhesive.

14. The method of claim 11, wherein the magnetic material is formed directly on the package cover by one of deposition, sputtering or spraying.

15. The method of claim 11, wherein the magnetic material is affixed to the integrated circuit.

16. A method for packaging an integrated circuit with one or more on-chip inductors formed on a top layer thereof, comprising:

affixing a magnetic material to a package PCB, such that the magnetic material is provided between the integrated circuit and the package cover and magnetically shielding the on-chip inductors from circuitry of the package PCB, wherein the magnetic material is not part of the integrated circuit's stack and the magnetic material is affixed to but not part of the package PCB; and flip-chip mounting the integrated circuit over the package PCB such that the magnetic material is provided between the integrated circuit and the package PCB.

17. The method of claim 16, wherein the magnetic material is a soft magnetic thin film.

18. The method of claim 16, wherein the magnetic material is affixed to the package cover by an adhesive.

19. The method of claim 16, wherein the magnetic material is formed directly on the package cover by one of deposition, sputtering or spraying.

20. The method of claim 16, wherein the magnetic material is affixed to the integrated circuit.

* * * * *